(12) United States Patent
Blanquart

(10) Patent No.: US 12,381,087 B2
(45) Date of Patent: Aug. 5, 2025

(54) METHODS FOR FILLING A GAP AND RELATED SYSTEMS AND DEVICES

(71) Applicant: ASM IP Holding, B.V., Almere (NL)

(72) Inventor: Timothee Blanquart, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 231 days.

(21) Appl. No.: 17/708,189

(22) Filed: Mar. 30, 2022

(65) Prior Publication Data

US 2022/0319855 A1 Oct. 6, 2022

Related U.S. Application Data

(60) Provisional application No. 63/170,127, filed on Apr. 2, 2021.

(51) Int. Cl.
| | |
|---|---|
| *C23C 16/04* | (2006.01) |
| *C23C 16/08* | (2006.01) |
| *C23C 16/18* | (2006.01) |
| *C23C 16/455* | (2006.01) |
| *H01J 37/32* | (2006.01) |
| *H01L 21/285* | (2006.01) |

(52) U.S. Cl.
CPC ...... *H01L 21/28562* (2013.01); *C23C 16/045* (2013.01); *C23C 16/45538* (2013.01); *H01J 37/32082* (2013.01); *H01J 37/3244* (2013.01); *H01L 21/28568* (2013.01); *C23C 16/08* (2013.01); *C23C 16/18* (2013.01); *H01J 2237/332* (2013.01)

(58) Field of Classification Search
CPC ......... H01L 21/28562; H01L 21/28568; C23C 16/045; C23C 16/45538; C23C 16/08; C23C 16/18
See application file for complete search history.

(56) References Cited

U.S. PATENT DOCUMENTS

| | | | |
|---|---|---|---|
| 2015/0243545 A1* | 8/2015 | Tang | H01L 21/76837 118/704 |
| 2017/0117134 A1* | 4/2017 | Henri | H01L 21/02592 |
| 2020/0013616 A1* | 1/2020 | Abel | C23C 16/0245 |
| 2021/0391431 A1* | 12/2021 | Huang | H01L 29/41791 |

OTHER PUBLICATIONS

Musschoot, et al. "Atomic layer deposition of titanium nitride from TDMAT precursor"; Microelectronic Engineering 86 (2009): 72-77.

* cited by examiner

*Primary Examiner* — Kelly M Gambetta
(74) *Attorney, Agent, or Firm* — Snell & Wilmer L.L.P.

(57) ABSTRACT

Methods and related systems for filling a gap feature comprised in a substrate are disclosed. The methods comprise a step of providing a substrate comprising one or more gap features into a reaction chamber. The one or more gap features comprise a proximal part comprising a proximal surface and a distal part comprising a distal surface. The methods further comprise a step of subjecting the substrate to a plasma treatment. Thus the proximal surface is inhibited while leaving the distal surface substantially unaffected. Then, the methods comprise a step of selectively depositing a metal- and nitrogen-containing material on the distal surface.

19 Claims, 8 Drawing Sheets

METHODS FOR FILLING A GAP AND RELATED SYSTEMS AND DEVICES

CROSS-REFERENCE TO RELATED APPLICATIONS

This application claims priority to U.S. Provisional Patent Application Ser. No. 63/170,127 filed Apr. 2, 2021 titled METHODS FOR FILLING A GAP AND RELATED SYSTEMS AND DEVICES, the disclosure of which is hereby incorporated by reference in its entirety.

FIELD OF INVENTION

The present disclosure generally relates to methods and systems suitable for forming electronic devices. More particularly, the disclosure relates to methods and systems that can be used for depositing a material in gaps, trenches, and the like.

BACKGROUND OF THE DISCLOSURE

The scaling of semiconductor devices has led to significant improvements in speed and density of integrated circuits. However, with miniaturization of wiring pitch of large scale integration devices, void-free filling of high aspect ratio gaps or trenches (e.g., trenches having an aspect ratio of three or higher) becomes increasingly difficult due to limitations of existing deposition processes. Therefore, there is a need for processes that efficiently fill high aspect ratio features, e.g., gaps such as trenches on semiconductor substrates, for example in the context of logic and/or memory devices. There is a particular need for processes that efficiently fill high aspect ratio features with conductive materials such as transition metal nitrides that adequately withstand subsequent chemical mechanical polishing (CMP) steps and etching processes.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to gap filling methods, to structures and devices formed using such methods, and to apparatus for performing the methods and/or for forming the structure and/or devices. The ways in which various embodiments of the present disclosure address drawbacks of prior methods and systems are discussed in more detail below.

Described herein is a method for filling a gap feature. The method comprises, in the given order: a step of positioning a substrate on a substrate support in a reaction chamber; a step of subjecting the substrate to a plasma treatment; and, a step of selectively depositing a metal nitride on the distal surface. The substrate comprises a substrate surface. The substrate surface comprises one or more gap features. The one or more gap features comprise a proximal part comprising a proximal surface and a distal part comprising a distal surface. The plasma treatment results in selectively inhibiting the proximal surface with respect to the distal surface.

In some embodiments, a plurality of super-cycles are executed. A super cycle comprises the step of subjecting the substrate to a plasma treatment and the step of selectively depositing a metal nitride on the distal surface.

In some embodiments, the plasma pre-treatment comprises exposing the substrate to a nitrogen plasma.

In some embodiments, the step of selectively depositing the metal nitride on the distal surface comprises a cyclical process. The cyclical process comprises a plurality of sub cycles. A sub cycle comprises, in the given order: a step of exposing the substrate to a metal precursor; and, a step of exposing the substrate to a nitrogen reactant. The step of exposing the substrate to a metal precursor results in formation chemisorbed metal precursor on the distal surface. The step of exposing the substrate to a nitrogen reactant causes the nitrogen reactant to react with the chemisorbed metal precursor. Thus, a metal nitride is formed on the distal surface.

In some embodiments, the step of exposing the substrate to a metal precursor and the step of exposing the substrate to a nitrogen reactant are separated by an intra sub cycle purge.

In some embodiments, subsequent sub-cycles are separated by an inter sub cycle purge.

In some embodiments, the metal comprises a transition metal.

In some embodiments, the transition metal comprises titanium.

In some embodiments, the metal precursor comprises one or more alkylamine ligands.

In some embodiments, the metal precursor has a general formula of $M(NR_2)_n$, wherein M is a metal, R is a linear or branched C1 to C4 alkyl, and n is an integer from at least 2 to at most 5.

In some embodiments, R is methyl.

In some embodiments, n is 4.

In some embodiments, the metal precursor comprises a metal halide.

In some embodiments, the metal halide comprises a chloride.

In some embodiments, the metal halide comprises $TiCl_4$.

In some embodiments, the nitrogen reactant comprises $NH_3$.

In some embodiments, the substrate is maintained at a temperature of at least 50° C. to at most 300° C.

In some embodiments, the step of selectively depositing a material on the distal surface is done at a growth rate of at least 0.01 Å per sub cycle to at most 1.0 Å per sub cycle.

In some embodiments, the step of subjecting the substrate to a plasma treatment and the step of selectively depositing a metal nitride on the distal surface are separated by a post-plasma purge.

Further described herein is a semiconductor processing apparatus. The semiconductor processing apparatus comprises a reaction chamber, a heater, a plasma gas source, a plasma module, a metal precursor source, a nitrogen reactant source, and a controller. The reaction chamber comprises a substrate support for supporting a substrate. The substrate comprises one or more gap features. The heater is constructed and arranged to heat the substrate in the reaction chamber. The plasma gas source is in fluid communication with the reaction chamber via a plasma valve. The plasma module comprises a radio frequency power source that is constructed and arranged to generate a plasma in the reaction chamber. The metal precursor source is in fluid connection with the reaction chamber via one or more metal precursor valves. The nitrogen reactant source is in fluid connection with the reaction chamber via one or more nitrogen reactant valves. The controller is configured for causing the apparatus to perform a method as described herein.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
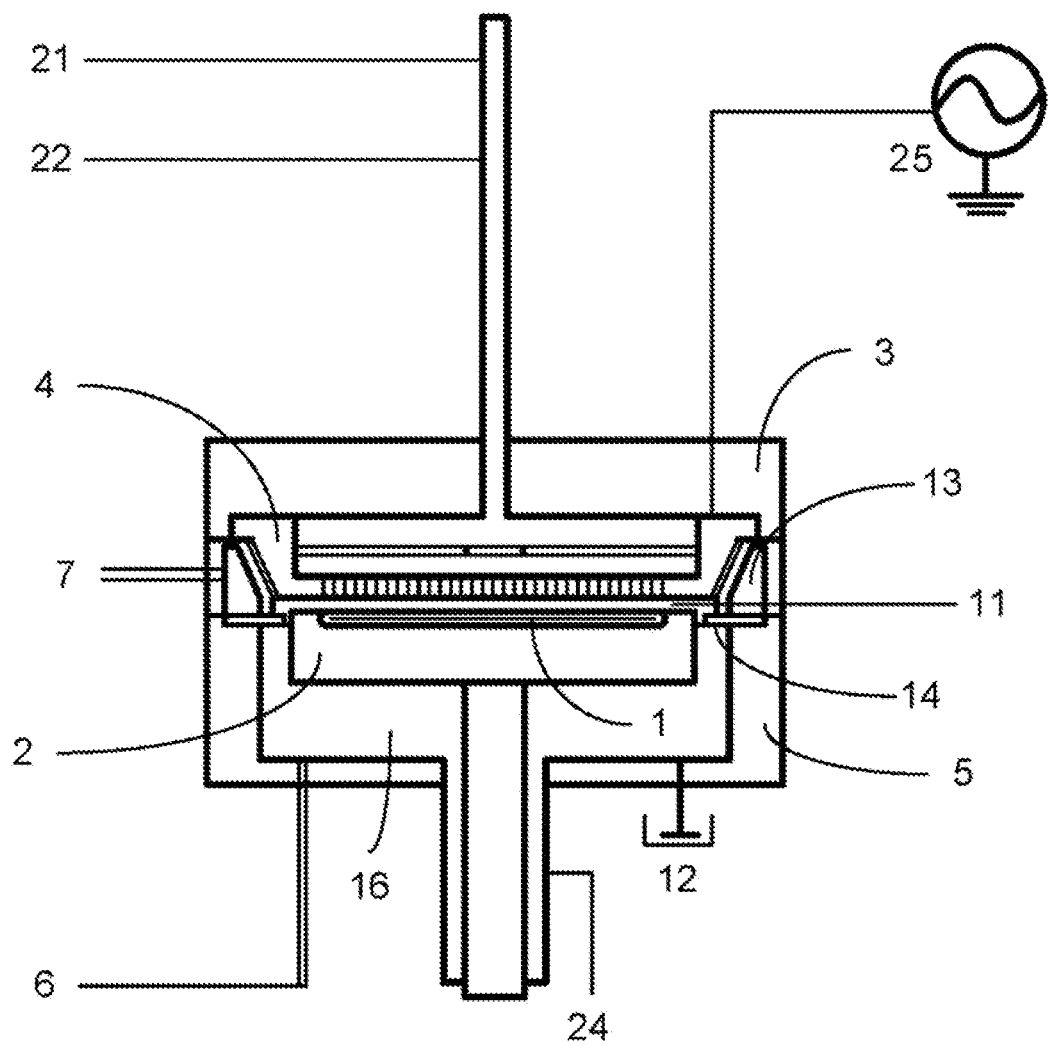
FIG. 1 is a schematic representation of a semiconductor processing apparatus arranged for performing a method in accordance with at least one embodiment of the present disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gasses, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a rare gas. The terms "rare gas" and "noble gas" as used herein may be used interchangeably. In some cases, the term "precursor" can refer to a compound that participates in the chemical reaction that produces another compound, and particularly to a compound that constitutes a film matrix or a main skeleton of a film, or that is incorporated in a film as a constituent part thereof; the term "reactant" may be used interchangeably with the term precursor.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as a Group II-VI or Group III-V semiconductor, and can include one or more layers overlying or underlying the bulk material.

In some embodiments, "metal" refers to an element that, as an elemental solid, forms a metallic material. In some embodiments, "metal" incudes elements that, as an elemental solid, form a semiconducting material.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

As used herein, the term "comprising" indicates that certain features are included, but that it does not exclude the presence of other features, as long as they do not render the claim or embodiment unworkable. In some embodiments, the term "comprising" includes "consisting". As used herein, the term "consisting" indicates that no further features are present in the apparatus/method/product apart from the ones following said wording. When the term "consisting" is used referring to a chemical compound, it indicates that the chemical compound only contains the components which are listed.

As used herein, the term "purge" refers to a process step in which precursor and/or reactive species are removed from a reaction chamber. During a purge, an inert or substantially inert gas can be provided to the reaction chamber. Additionally or alternatively, the reaction chamber may be evacuated during a purge.

Described herein is a method for filling a gap feature. The gap feature is comprised in a substrate, and can be located at or near the substrate's surface. Optionally, the substrate can comprise multiple gap features, e.g., a plurality of gap features. A gap feature comprises a proximal part comprising a proximal surface and a distal part comprising a distal surface. Suitable substrates include semiconductor wafers, e.g., silicon wafers. The present methods can be used during the manufacture of various semiconductor devices and are particularly useful for filling gap features having a high aspect ratio and a particularly small width, e.g., having a width smaller than 10 nm and an aspect ratio higher than 2, or 5, or 10, or 20. Such gaps can, by means of a method as described herein, be advantageously filled without formation of any seams or voids.

The method comprises a step of positioning a substrate on a substrate support. The substrate support is located in a reaction chamber. The substrate comprises one or more gap features. A gap feature comprises a proximal part comprising a proximal surface and a distal part comprising a distal surface. It shall be understood that the proximal part of a gap feature refers to that part of the gap feature that is the closest to the surface of the substrate, and that the distal part of a gap features refers to a part of the gap feature that is the farthest removed from the surface of the substrate. The method further comprises a step of subjecting the substrate to a plasma treatment and a step of selectively depositing a metal nitride on the distal surface. Optionally, a purge is performed between the step of subjecting the substrate to a plasma treatment and the step of selectively depositing a metal nitride on the distal surface. It shall be understood that no plasma is generated in the reaction chamber during the purge.

It shall be understood that the aforementioned steps are carried out in the following order: positioning the substrate on the substrate support, subjecting the substrate to a plasma treatment, and selectively depositing the metal nitride on the distal surface.

The step of subjecting the substrate to a plasma treatment results in selective inhibition of the proximal surface with respect to the distal surface. In other words, the plasma treatment results in a reduction of active surface sites on the proximal surface with respect to the distal surface. In other words, the plasma treatment causes a precursor to absorb less readily on the proximal surface compared to the distal surface. Thus, when a metal nitride is subsequently deposited, the metal nitride is selectively deposited on the distal surface with respect to the proximal surface. In other words, the growth rate of a metal nitride on the distal surface is higher than the growth rate of the metal nitride on the proximal surface. For example, the plasma treatment can preferentially deactivate reactive surface sites on the proximal surface while leaving similar surface sites on the distal surface relatively unaffected. Consequentially, and when selectively growing the metal nitride on the distal surface comprises exposing the substrate to a metal precursor, the metal precursor preferentially chemisorbs on the distal surface instead of the proximal surface. When the substrate is then exposed to a nitrogen reactant, the metal nitride is preferentially formed on the distal surface.

In some embodiments, the method comprises entirely filling the gap feature with the metal nitride. This can be done, for example, by repeating a cyclical process as described herein until the entire gap feature is filled with the convertible layer.

In some embodiments, the plasma pre-treatment comprises exposing the substrate to a nitrogen plasma. In some embodiments, $N_2$ is used as a plasma gas while exposing the substrate to the nitrogen plasma. In some embodiments, the nitrogen-containing plasma is an $NH_3$ plasma. It shall be understood that an $N_2$ plasma refers to a plasma in which the plasma gas comprises $N_2$. It shall be understood that an $NH_3$ plasma refers to a plasma in which the plasma gas comprises $NH_3$. It shall be understood that other plasmas are defined analogously.

In some embodiments, the plasma pre-treatment comprises subjecting the substrate to a noble gas plasma. In some embodiments, the noble gas plasma is an argon plasma. A noble gas plasma such as an Ar plasma can be used, in some embodiments, for activating or inhibiting certain surfaces. In some embodiments, a noble gas plasma such as an Ar plasma can be used for removing a surface termination, such as at least one of —OH and —NH surface terminations. It shall be understood that a nitrogen plasma refers to a plasma in which a nitrogen-containing gas is used as a plasma gas. Similarly, a noble gas plasma refers to a plasma in which a gas comprising a noble gas is used as a plasma gas. Similarly, an argon plasma refers to a plasma in which a gas comprising argon is used as a plasma gas. It shall be understood that other plasmas are defined analogously.

It shall be understood that the application of the plasma pre-treatment results in an inhibition of the proximal surface whereas the distal surface is left substantially unaffected, or at least less affected than the proximal surface. In other words, the proximal surface can be suitably rendered less reactive towards a metal precursor that can be subsequently provided to the reaction chamber. Stated differently still, subjecting the substrate to the plasma pre-treatment can result in an inhibition gradient in the gap feature. In particular, the inhibition is stronger in the proximal part of the gap than in the distal part of the gap. In other words, the inhibition gradually decreases going from the proximal part of the gap to the distal part of the gap. Without the invention being bound to any particular theory or mode of operation, it is believed that the inhibition at the proximal surface is caused by depletion of reactive surface groups near the substrate's surface, whereas reactive surface groups deeper in the gap, near the distal surface, i.e., near the bottom of the trench, are believed to be less, or not, affected by the plasma pre-treatment.

In some embodiments, the plasma pre-treatment results in a passivation gradient, i.e., a gradual change of passivation intensity, from the proximal surface towards the distal surface. In such a case, the step of exposing the substrate to a precursor can result in a gradual change in the density of chemisorbed precursor per unit area from the distal surface to the upper surface. Subsequently exposing the substrate to a nitrogen reactant then allows nitrogen-containing species to react with the chemisorbed precursor to form a metal nitride. Since more precursor is chemisorbed on the distal surface compared to the upper surface, more metal nitride is formed on the distal surface compared to the upper surface. In other words, the metal nitride is grown in a bottom-up way.

In some embodiments, the method comprises executing a plurality of super-cycles. A super cycle comprises the step of subjecting the substrate to a plasma treatment, and the step of selectively depositing a metal nitride on the distal surface. The amount of super-cycles can be suitable chosen such that, at the end of a method as described herein, a desired thickness of metal nitride has been deposited on the distal surface. In some embodiments, the method comprises executing a super cycle for at least 5 times to at most 10000 times, or from at least 10 times to at most 5000 times, or from at least 20 times to at most 2000 times, or from at least 50 times to at most 1000 times, or from at least 100 times to at most 500 times. In some embodiments, the method comprises executing a super cycle from at least 5 times to at most 50 times, or from at least 10 times to at most 20 times. In some embodiments, consecutive super cycles are separated from each other by means of a purge. It shall be understood that no plasma is generated in the reaction chamber during the purge. In some embodiments, a cyclical process as described herein comprises from at least 2 super cycles to at most 20000 super cycles. For example, a cyclical deposition process can comprise 2 super cycles, 3 super cycles, 5 super cycles, 10 super cycles, 20 super cycles, 30 super cycles, 60 super cycles, 100 super cycles, 200 super cycles, 500 super cycles, 1000 super cycles, 2000 super cycles, 5000 super cycles, or 10000 super cycles.

In some embodiments, selectively depositing a metal nitride on the distal surface is done thermally. In other words, and in some embodiments, no plasma is generated in the reaction chamber while the metal nitride is selectively deposited on the distal surface. This can improve the gap filling properties of a method as described herein.

In some embodiments, the step of selectively depositing the metal nitride on the distal surface comprises a cyclical process. The cyclical process comprises a plurality of sub cycles. A sub cycle comprises, in the following order: exposing the substrate to a metal precursor, and exposing the substrate to a nitrogen reactant. Exposing the substrate to a metal precursor results in the formation of chemisorbed metal precursor on the distal surface. Subsequently exposing the substrate to a nitrogen reactant then allows the nitrogen reactant to react with the chemisorbed metal precursor. Thus, a metal nitride is formed on the distal surface.

In some embodiments, the cyclical process is thermal. In other words, and in some embodiments, no plasma is generated in the reaction chamber during the sub cycles. In other words, and in some embodiments, no plasma is generated in the reaction chamber while exposing the substrate to a metal precursor and while exposing the substrate to a nitrogen reactant.

In some embodiments, the step of selectively depositing a metal nitride on the distal surface is done at a growth rate of at least 0.1 Å/sub cycle to at most 10 Å/cycle, for example a growth rate of from at least 0.2 Å/sub cycle to at most 3 Å/sub cycle, or from at least 0.3 to at most 1 Å/sub cycle. For example, the metal nitride is deposited on the distal surface at a growth rate of 0.49 Å/sub cycle. In some embodiments, the growth rate on the proximal surface is from at least 2 to at most 20 times slower on the upper surface. In some embodiments, the growth rate on the proximal surface is from at least 2 to at most 5 times slower on the upper surface. In some embodiments, the growth rate on the proximal surface is from at least 5 to at most 10 times slower on the upper surface. In some embodiments, the growth rate on the proximal surface is from at least 10 to at most 20 times slower on the upper surface. In some embodiments, the growth rate on the proximal surface is less than 0.1 Å/sub cycle. In some embodiments, the growth rate on the proximal surface is 0 Å/sub cycle.

In some embodiments, a cyclical process as described herein comprises from at least 2 sub cycles to at most 20000 sub cycles per super cycle. For example, a cyclical deposition process can comprise 2 sub cycles, 3 sub cycles, 5 sub cycles, 10 sub cycles, 20 sub cycles, 30 sub cycles, 60 sub cycles, 100 sub cycles, 200 sub cycles, 500 sub cycles, 1000 sub cycles, 2000 sub cycles, 5000 sub cycles, 10000 sub cycles, or more for each super cycle.

Optionally, step of exposing the substrate to the metal precursor is followed by a purge. Optionally, subsequent sub cycles are separated by a purge. It shall be understood that no plasma is generated in the reaction chamber during the purges.

It shall be understood that the step of exposing the substrate to a metal precursor results in preferential chemisorption of the metal precursor on the distal surface. In other words, by exposing the substrate to the metal precursor, more metal precursor is chemisorbed on the unpassivated distal surface compared to the plasma-passivated proximal surface.

Any two subsequent process steps of a method as described herein may be separated by a purge step.

Thus, and in some embodiments, the step of subjecting the substrate to a plasma treatment and the step of selectively depositing a metal nitride on the distal surface are separated by a post-plasma purge.

Additionally or alternatively, and in some embodiments, the step of exposing the substrate to a metal precursor and the step of exposing the substrate to a nitrogen reactant are separated by an intra sub cycle purge.

Additionally or alternatively, and in some embodiments, subsequent sub-cycles are separated by an inter sub cycle purge.

In some embodiments, the step of subjecting the substrate to a plasma treatment lasts from at least 1 s to at most 100 s, or from at least 1 s to at most 2 s, or from at least 2 s to at most 5 s, or from at least 5 s to at most 10 s, or from at least 10 s to at most 20 s, or from at least 20 s to at most 50 s, or from at least 50 s to at most 100 s.

In some embodiments, the step of exposing the substrate to a metal precursor lasts from at least 0.01 s to at most 100 s, or from at least 0.01 s to at most 0.02 s, or from at least 0.02 s to at most 0.05 s, or from at least 0.05 s to at most 0.1 s, or from at least 0.1 s to at most 0.2 s, or from at least 0.2 s to at most 0.5 s, or from at least 0.5 s to at most 1 s, or from at least 1 s to at most 2 s, or from at least 2 s to at most 5 s, or from at least 5 s to at most 10 s, or from at least 10 s to at most 20 s, or from at least 20 s to at most 50 s, or from at least 50 s to at most 100 s.

In some embodiments, the step of exposing the substrate to a nitrogen reactant lasts from at least 0.01 s to at most 100 s, or from at least 0.01 s to at most 0.02 s, or from at least 0.02 s to at most 0.05 s, or from at least 0.05 s to at most 0.1 s, or from at least 0.1 s to at most 0.2 s, or from at least 0.2 s to at most 0.5 s, or from at least 0.5 s to at most 1 s, or from at least 1 s to at most 2 s, or from at least 2 s to at most 5 s, or from at least 5 s to at most 10 s, or from at least 10 s to at most 20 s, or from at least 20 s to at most 50 s, or from at least 50 s to at most 100 s.

In some embodiments, the inter sub cycle purge lasts from at least 0.01 s to at most 100 s, or from at least 0.01 s to at most 0.02 s, or from at least 0.02 s to at most 0.05 s, or from at least 0.05 s to at most 0.1 s, or from at least 0.1 s to at most 0.2 s, or from at least 0.2 s to at most 0.5 s, or from at least 0.5 s to at most 1 s, or from at least 1 s to at most 2 s, or from at least 2 s to at most 5 s, or from at least 5 s to at most 10 s, or from at least 10 s to at most 20 s, or from at least 20 s to at most 50 s, or from at least 50 s to at most 100 s.

In some embodiments, the intra sub cycle purge lasts from at least 0.01 s to at most 100 s, or from at least 0.01 s to at most 0.02 s, or from at least 0.02 s to at most 0.05 s, or from at least 0.05 s to at most 0.1 s, or from at least 0.1 s to at most 0.2 s, or from at least 0.2 s to at most 0.5 s, or from at least 0.5 s to at most 1 s, or from at least 1 s to at most 2 s, or from at least 2 s to at most 5 s, or from at least 5 s to at most 10 s, or from at least 10 s to at most 20 s, or from at least 20 s to at most 50 s, or from at least 50 s to at most 100 s.

In some embodiments, the nitrogen reactant comprises $NH_3$. In some embodiments, the nitrogen reactant comprises $N_2H_2$.

In some embodiments, the metal comprised in the metal precursor comprises a transition metal. In some embodiments, the metal comprised in the metal precursor consists of a transition metal. Suitable transition metals include Sc, Ti, V, Cr, Mn, Fe, Co, Ni, Cu, Zn, Y, Zr, Nb, Mo, Tc, Ru, Rh, Cd, Hf, Ta, W, and Re. In some embodiments, the transition metal comprises titanium. In some embodiments, the transition metal consists of titanium.

In some embodiments, the metal comprised in the metal precursor comprises a rare earth element. In some embodiments, the metal comprised in the metal precursor consists of a rare earth element. Suitable rare earth elements include lanthanides such as La, Ce, Pr, Nd, Pm, Sm, Eu, Gd, Tb, Dy, Ho, Er, Tm, Yb, and Lu.

The metal precursor can, in some embodiments, comprise one or more alkylamine ligands. In some embodiments, the metal precursor comprises one or more ligands selected from $NH_2$, $NHR^i$, and $NR^iR^{ii}$, with at least one of $R^i$ and $R^{ii}$ being a C1 to C4 alkyl.

In some embodiments, the metal precursor has a general formula of $M(NR_2)_n$, wherein M is a metal, R is a linear or branched C1 to C4 alkyl, and is an integer from at least 2 to at most 5. In some embodiments, R is methyl. In some embodiments, n is 4. In some embodiments, the metal precursor comprises tetrakis(dimethylamido)titanium(IV).

In some embodiments, the metal precursor comprises a metal halide.

Exemplary metal halides include fluorides, chlorides, bromides, and iodides. In some embodiments, the metal precursor comprises a chloride.

In some embodiments, the metal precursor comprises a transition metal halide. In some embodiments, the metal precursor comprises a transition metal fluoride. In some embodiments, the metal precursor comprises a transition metal chloride. In some embodiments, the metal precursor comprises a transition metal bromide. In some embodiments, the metal precursor comprises a transition metal iodide.

In some embodiments, the metal precursor is selected from a zirconium halide, a hafnium halide, a niobium halide, a tantalum halide, a vanadium halide, a molybdenum halide, a titanium halide, and a tungsten halide.

In some embodiments, the metal precursor is selected from a zirconium fluoride, a hafnium fluoride, a niobium fluoride, a tantalum fluoride, a vanadium fluoride, a molybdenum fluoride, a titanium fluoride, and a tungsten fluoride.

In some embodiments, the metal precursor is selected from a zirconium chloride, a hafnium chloride, a niobium chloride, a tantalum chloride, a vanadium chloride, a molybdenum chloride, a titanium chloride, and a tungsten chloride.

In some embodiments, the metal precursor is selected from a zirconium bromide, a hafnium bromide, a niobium bromide, a tantalum bromide, a vanadium bromide, a molybdenum bromide, a titanium bromide, and a tungsten bromide.

In some embodiments, the metal precursor is selected from a zirconium iodide, a hafnium iodide, a niobium iodide, a tantalum iodide, a vanadium iodide, a molybdenum iodide, a titanium iodide, and a tungsten iodide.

In some embodiments, the metal precursor is selected from the list consisting of $ZrCl_4$, $HfCl_4$, $NbCl_4$, $TaCl_5$, $VCl_5$, $Mo_2Cl_{20}$, $TiI_4$, and $WCl_6$. In some embodiments, the metal precursor comprises $TiCl_4$.

In some embodiments, the metal precursor comprises a halide of a group IVA element. In some embodiments, the metal precursor comprises a silicon halide. In some embodiments, the metal precursor comprises a germanium halide. In some embodiments, the metal precursor comprises a silicon chloride. In some embodiments, the metal precursor comprises a germanium chloride. In some embodiments, the metal precursor comprises a silicon bromide. In some embodiments, the metal precursor comprises a germanium bromide. In some embodiments, the metal precursor comprises a silicon iodide. In some embodiments, the metal precursor comprises a germanium iodide. In some embodiments, the metal precursor is selected from $SiCl_4$, $SiIH_2$, $Si_2Cl_6$, and $GeCl_4$.

In some embodiments, the substrate is maintained at a temperature of at least 50° C. to at most 600° C., or at a temperature of at least 50° C. to at most 400° C., or at a temperature of at least 100° C. to at most 350° C., or at a temperature of at least 150° C. to at most 200° C., or at a temperature of at least 200° C. to at most 250° C., or at a temperature of at least 250° C. to at most 300° C.

In some embodiments, the reaction chamber is maintained at a pressure of at least 0.1 Torr to at most 200 Torr, or of at least 0.2 Torr to at most 100 Torr, or of at least 0.5 Torr to at most 50 Torr, or of at least 1 Torr to at most 20 Torr, or of at least 2 Torr to at most 10 Torr, e.g., the reaction chamber can be maintained at a pressure of 5 Torr. In some embodiments, the reaction chamber is maintained at a pressure of at least 1 Torr to at most 20 Torr.

In some embodiments, the step of selectively depositing a metal nitride on the distal surface is done at a growth rate of at least 0.1 Å per sub cycle to at most 1.5 Å per sub cycle, or of at least 0.2 Å per sub cycle to at most 1 Å per sub cycle, or of at least 0.3 Å per sub cycle to at most 1 Å per sub cycle, It shall be understood that these growth rates refer to the growth rate of the metal nitride on the distal surface.

In some embodiments, and during the step of selectively depositing a metal nitride on the distal surface, the growth rate of metal nitride on the proximal surface is from at least 0% to at most 99% of the growth rate of metal nitride on the distal surface, or the growth rate of metal nitride on the proximal surface is from at least 0% to at most 1% of the growth rate of metal nitride on the distal surface, or the growth rate of metal nitride on the proximal surface is from at least 1% to at most 2% of the growth rate of metal nitride on the distal surface, or the growth rate of metal nitride on the proximal surface is from at least 2% to at most 5% of the growth rate of metal nitride on the distal surface, or the growth rate of metal nitride on the proximal surface is from at least 5% to at most 10% of the growth rate of metal nitride on the distal surface, or the growth rate of metal nitride on the proximal surface is from at least 10% to at most 20% of the growth rate of metal nitride on the distal surface, or the growth rate of metal nitride on the proximal surface is from at least 20% to at most 50% of the growth rate of metal nitride on the distal surface, or the growth rate of metal nitride on the proximal surface is from at least 50% to at most 90% of the growth rate of metal nitride on the distal surface, or the growth rate of metal nitride on the proximal surface is from at least 90% to at most 95% of the growth rate of metal nitride on the distal surface, or the growth rate of metal nitride on the proximal surface is from at least 95% to at most 99% of the growth rate of metal nitride on the distal surface.

Further described herein is a semiconductor processing apparatus. The semiconductor processing apparatus comprises a reaction chamber, a substrate heater, a plasma gas source, a plasma module, a metal precursor source, a nitrogen reactant source, and a controller. The reaction chamber comprises a substrate support for supporting a substrate. The substrate comprises one or more, e.g., a plurality of, gap features. The heater is constructed and arranged to heat the substrate in the reaction chamber. The plasma gas source is in fluid communication with the reaction chamber via a plasma valve. The plasma module comprises a radio frequency power source constructed and arranged to generate a plasma in the reaction chamber. The metal precursor source is in fluid connection with the reaction chamber via one or more metal precursor valves. The nitrogen reactant source is in fluid connection with the reaction chamber via one or more nitrogen reactant valves. The controller is configured for causing the apparatus to perform a method as described herein.

Optionally, the apparatus is configured for providing at least one of the precursors to the reaction chamber by means of a carrier gas. Suitable carrier gasses include noble gasses. In other words, in some embodiments, the semiconductor processing system comprises a gas injection system comprising a precursor delivery system that employs a carrier gas for carrying the metal precursor to one or more reaction chambers.

The presently provided methods may be executed in any suitable apparatus, including in an embodiment of a semiconductor processing system as shown in FIG. 1. FIG. 1 is a schematic view of a plasma-enhanced atomic layer deposition (PEALD) apparatus, usable in some embodiments of the present invention. In this figure, by providing a pair of electrically conductive flat-plate electrodes (2,4) in parallel and facing each other in the interior (11) (reaction zone) of a reaction chamber (3), applying RF power (e.g., at 13.56 MHz and/or 27 MHz) from a power source (25) to one side, and electrically grounding the other side (12), a plasma can be generated between the electrodes. There is no need for the semiconductor processing apparatus to generate a plasma during the steps when a metal precursor is provided to the reaction chamber, during steps when a nitrogen reactant is provided to the reaction chamber, or during purges between subsequent processing steps, and thus no RF power need be applied to any one of the electrodes during those steps or purges. A temperature regulator may be provided in a lower stage (2), i.e., the lower electrode. A substrate (1) is placed thereon and its temperature is kept constant at a given temperature. The upper electrode (4) can serve as a shower plate as well, and various gasses such as a plasma gas, a reactant gas and/or a dilution gas, if any, as well as a precursor gas can be introduced into the reaction chamber (3) through a gas line (21) and a gas line (22), respectively, and through the shower plate (4). Additionally, in the reaction chamber (3), a circular duct (13) with an exhaust line (17) is provided, through which the gas in the interior (11) of the reaction chamber (3) is exhausted. Additionally, a transfer chamber (5) is disposed below the reaction chamber (3) and is provided with a gas seal line (24) to introduce seal gas into the interior (11) of the reaction chamber (3) via the interior (16) of the transfer chamber (5) wherein a separation plate (14) for separating the reaction zone and the transfer zone is provided. Note that a gate valve through which a wafer may be transferred into or from the transfer chamber (5) is omitted from this figure. The transfer chamber is also provided with an exhaust line (6). In some embodiments, the deposition of the silicon oxide and the surface treatment are performed in the same reaction space, so that all the steps can continuously be conducted without any need for intermediate steps of evacuating reaction chambers, pumping down reaction chambers, or exposing the substrate to atmospheric air.

Figure 2:
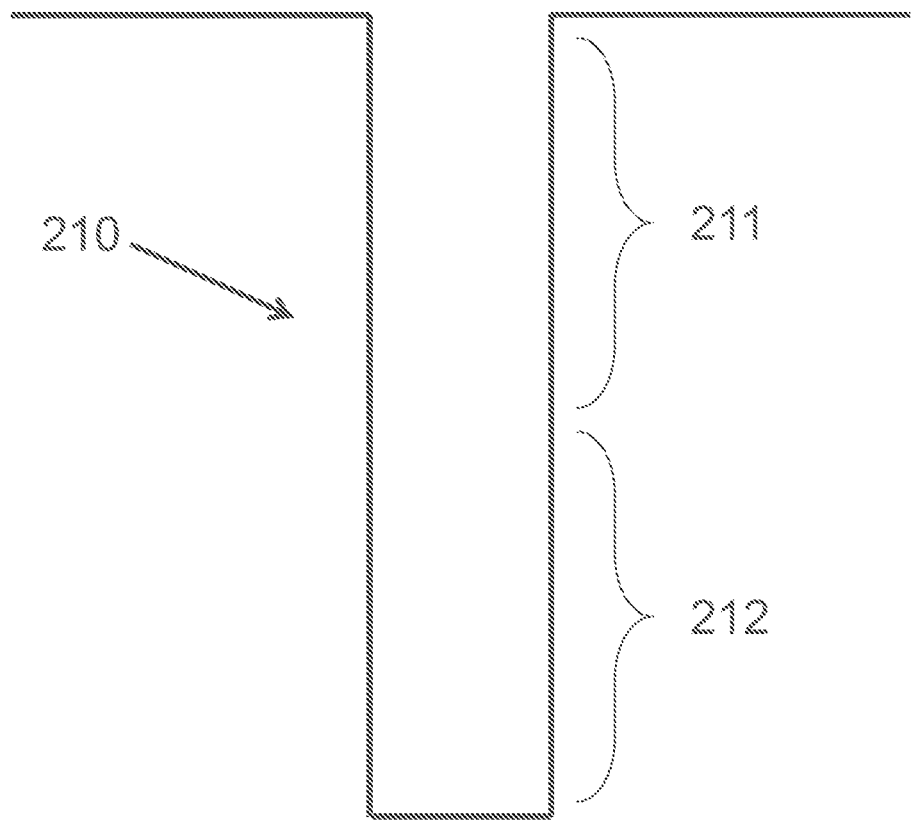
FIG. 2 shows a schematic representation of a substrate (200) comprising a gap feature (210).

FIG. 2 shows a schematic representation of a substrate (200) comprising a gap feature (210). The gap feature (210) comprises a proximal part (211) and a distal part (212). The proximal part (211) comprises an upper surface, and the distal part (212) comprises a distal surface. By subjecting the substrate (200) to a plasma treatment, the proximal surface can be substantially inhibited. In other words, the first and second plasma treatments can suitably render the proximal surface relatively unreactive towards a precursor compared to the distal surface.

Figure 3:
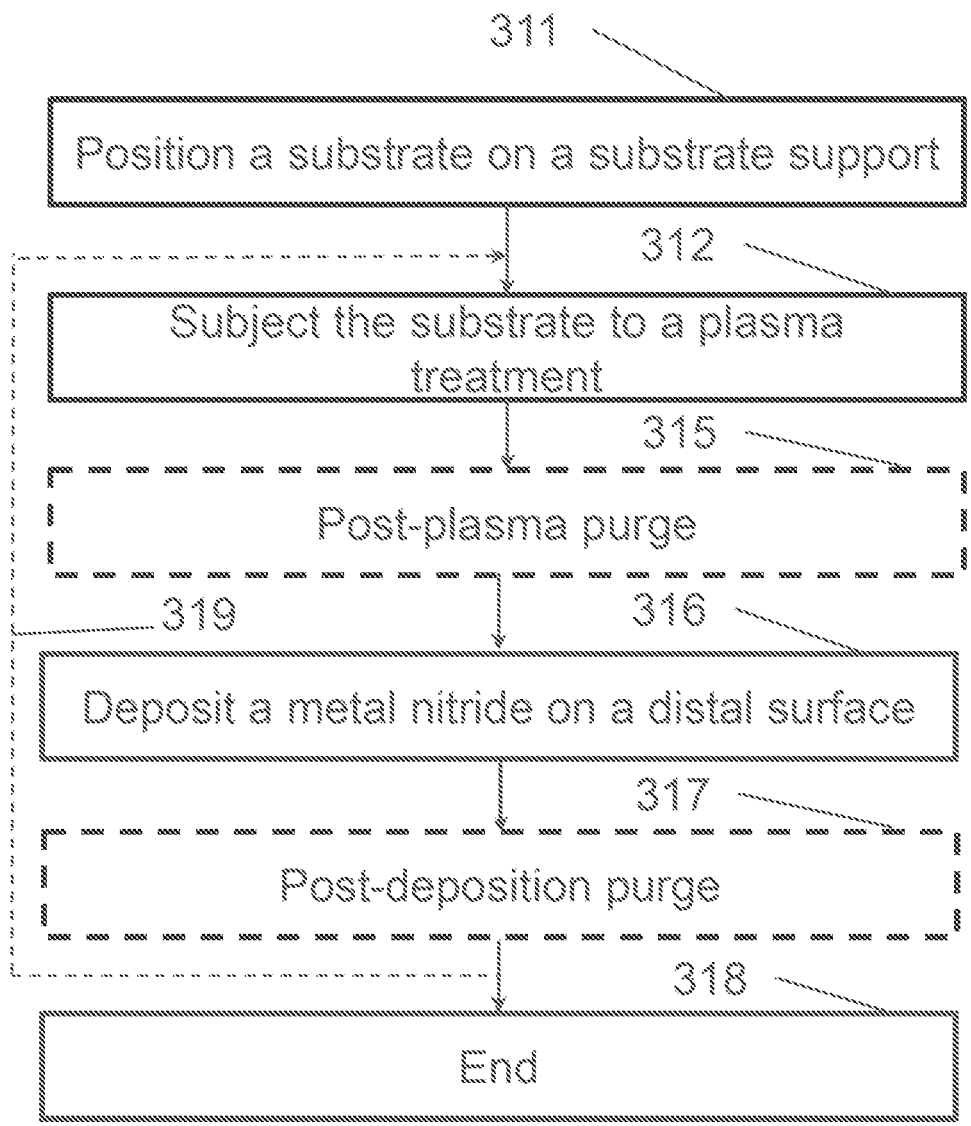
FIG. 3 shows a schematic representation of an embodiment of a method as described herein.

FIG. 3 shows a schematic representation of an embodiment of a method as described herein. The method comprises a step (311) of positioning a substrate on a substrate support. The substrate comprises a gap feature. The substrate is then subjected to a plasma treatment (312) as described herein. Optionally, the reaction chamber is then purged using a post-plasma purge (315). Purging can be done, for example, by means of a substantially inert gas such as a noble gas. Exemplary noble gasses include He, Ne, Ar, Xe, and Kr. Alternatively, purging can be done by means of a nitrogen-containing gas mixture, e.g., by a purge gas comprising, or consisting of, $N_2$. The method further comprises a step (316) of depositing a metal nitride on the distal surface of the gap feature, by means of a technique as described herein. Optionally, the reaction chamber is then purged using a post-deposition purge (317). It shall be understood that no plasma is generated in the reaction chamber during the purges. The steps from subjecting the substrate to a plasma treatment (312) to the step of depositing a metal nitride on the distal surface of the gap feature (316) can optionally be repeated (319) one or more times, thereby resulting in a plurality of super-cycles comprising subsequent plasma treatments followed by a deposition step. Optionally, subsequent super-cycles are separated by a purge. Thus, a metal nitride is deposited in the gap feature. When a desired amount of metal nitride has been deposited in the gap feature, the method ends (318).

Figure 4:
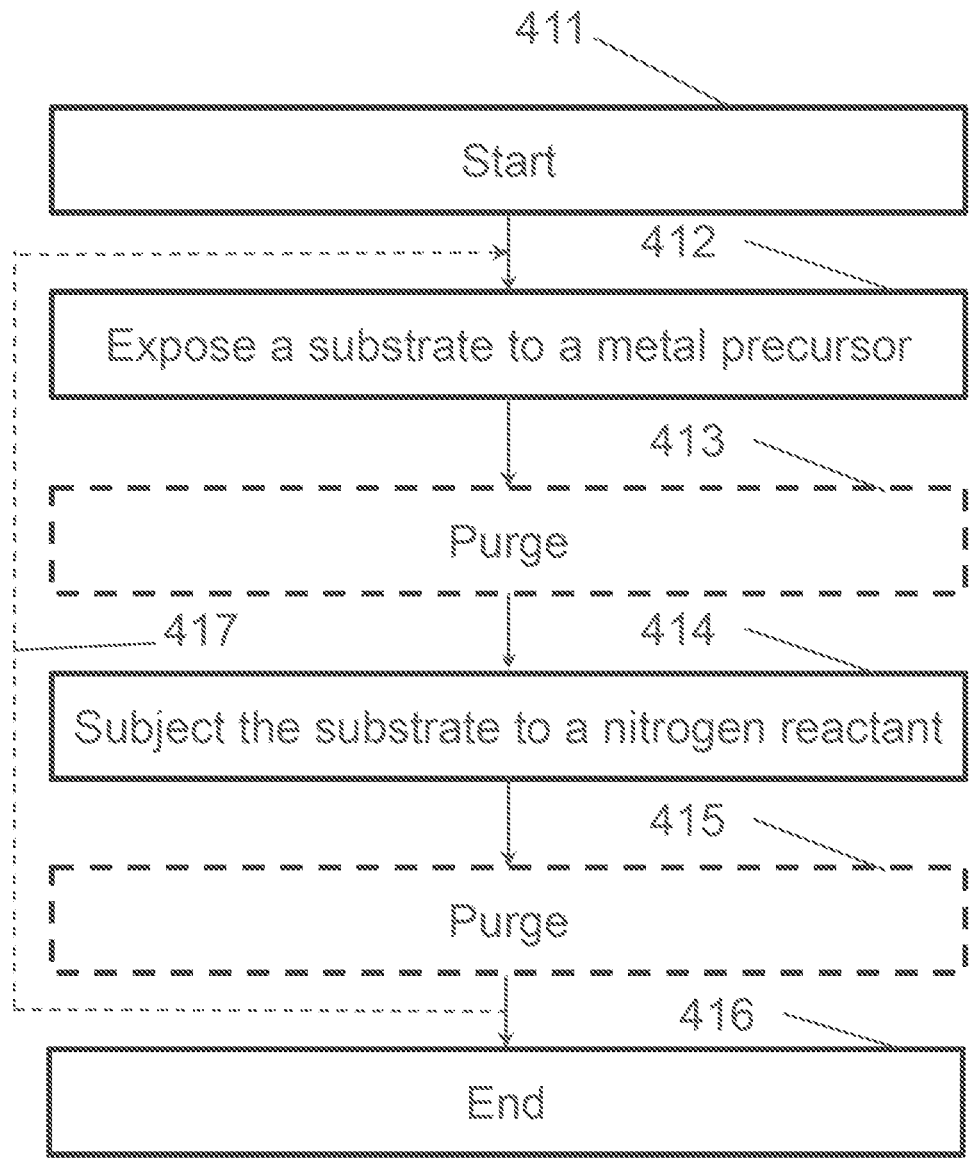
FIG. 4 shows a schematic representation of an embodiment of a part of a method for selectively depositing a metal nitride on the distal surface of a gap feature comprised in a substrate.

FIG. 4 shows a schematic representation of an embodiment of a part of a method for selectively depositing a metal nitride on the distal surface of a gap feature comprised in a substrate. The part of the method shown in FIG. 4 corresponds to the step of depositing a metal nitride on a distal surface (316) as shown in FIG. 3, and starts (411) after a step of subjecting the substrate to a plasma treatment, or optionally after a purge following such a step. The substrate is then exposed to a metal precursor (412) that selectively chemisorbs on the distal surface, as described herein. Optionally, the reaction chamber is then purged (413). The method then comprises a step of exposing the substrate to a nitrogen reactant (414). Optionally, the reaction chamber is then purged (415). It shall be understood that no plasma is generated in the reaction chamber during the purges. The steps from exposing the substrate to a metal precursor (412) to exposing the substrate to a nitrogen reactant (414) can optionally be repeated (417) one or more times, thereby resulting in a plurality of sub-cycles. Thus, a metal nitride is deposited in the gap feature. When a desired amount of metal nitride has been deposited in the gap, the method ends (416).

Figure 5:
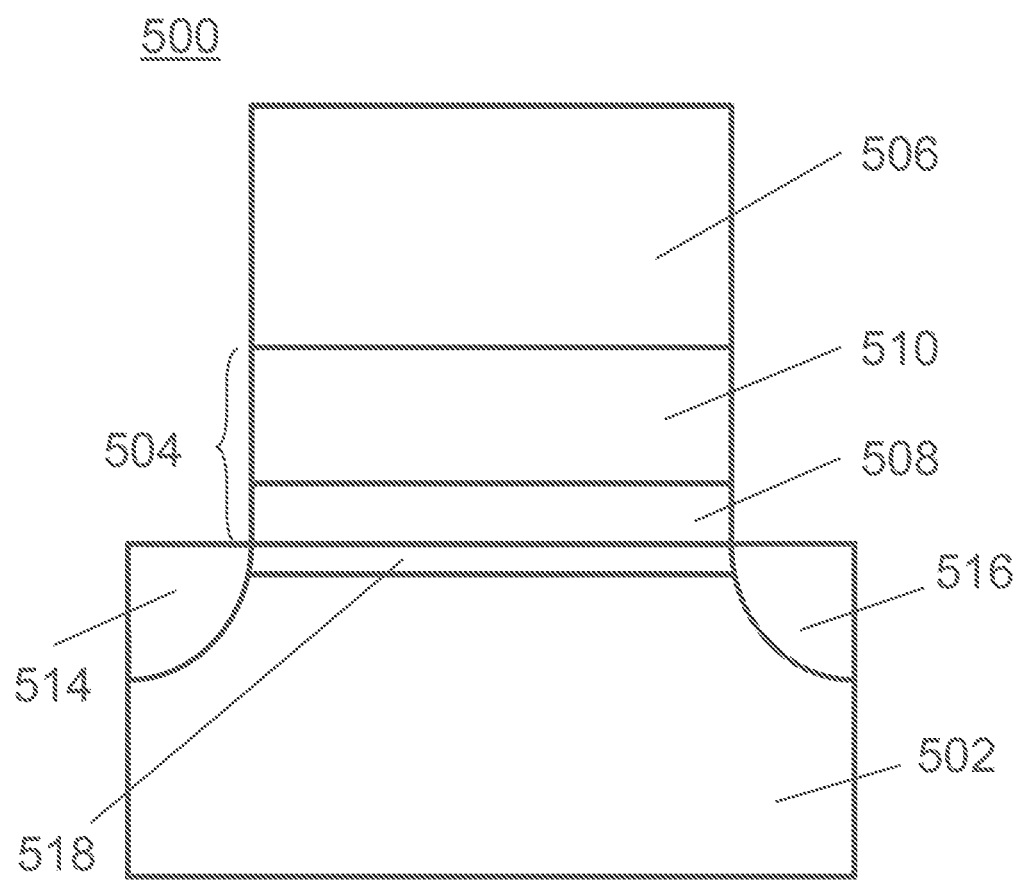
FIG. 5 illustrates an exemplary structure (500) in accordance with examples of the disclosure.

FIG. 5 illustrates an exemplary structure (500) in accordance with examples of the disclosure. The device or structure (500) includes a substrate (502), a dielectric material (504), and a metal nitride-containing layer (506) at least a part of which can be deposited according to a method as described herein. When at least a part of the layer (506) is formed using a method as described herein, a concentration of its constituents can vary from a bottom of the layer (506) to a top of the layer (506) by, for example, controlling an amount of precursor and/or reactant and/or respective pulse times during one or more deposition cycles. In some cases, the layer (506) can have a stoichiometric composition. A work function and other properties of this layer (506) can be altered by altering its composition. The layer (506) deposited according to a method as described herein can include impurities, such as halides, hydrogen, and the like. In some embodiments, the impurity content may be less than one atomic percent, less than 0.2 atomic percent, or less than 0.1 atomic percent, or less than 0.05 atomic percent, alone or combined.

A thickness of the layer (506) at least part of which is deposited by means of a method as described herein can vary according to application. By way of example, this layer (506) has a thickness that can be from at least 5 nm to at most 20 nm.

A work function of a layer (506) at least part of which is deposited according to a method as described herein can be >4.0 eV, >4.1 eV, >4.2 eV, >4.3 eV, >4.4 eV, >4.5 eV, >4.6 eV, >4.7 eV, >4.8 eV, >4.9 eV, >4.95 eV, or >5.0 eV. Alternatively, a work function of a layer (506) at least part of which is deposited according to a method as described herein can be <4.0 eV, <4.1 eV, <4.2 eV, <4.3 eV, <4.4 eV, <4.5 eV, <4.6 eV, <4.7 eV, <4.8 eV, <4.9 eV, <4.95 eV, or <5.0 eV.

The dielectric material (504) comprises an interface layer (508) and a bulk layer (510). The interface layer (508) can, for example, comprise a silicon oxide layer, a silicate layer, or a mixture thereof. The bulk layer (510) can comprise a high k dielectric layer. In some cases, the interface layer (508) may not exist or may not exist to an appreciable extent. The high-k material (510) can be or can include, for example, a metallic oxide having a dielectric constant greater than about 7. In some embodiments, the high-k material has a dielectric constant higher than the dielectric constant of silicon oxide. Exemplary high-k materials include one or more of hafnium oxide ($HfO_2$), tantalum oxide ($Ta_2O_5$), vanadium oxide ($VO_2$), zirconium oxide ($ZrO_2$), niobium oxide ($Nb_2O_5$), titanium oxide ($TiO_2$), aluminum oxide ($Al_2O_3$), lanthanum oxide ($La_2O_3$), mixtures thereof, and laminates thereof. Other exemplary high-k materials include silicates such as hafnium silicate ($HfSiO_x$), lanthanum silicate ($LaSiO_x$), titanium silicate ($TiSiO_x$), and thulium silicate ($TmSiO_x$), amongst others. In the illustrated example, the substrate (502) includes a source region (514), a drain region (516), and a channel region (518). Although illustrated as a horizontal structure, structures and devices in accordance with examples of the disclosure can include vertical and/or three-dimensional structures and devices, such as FinFET devices, and gate-all-around MOSFETs.

Figure 6:
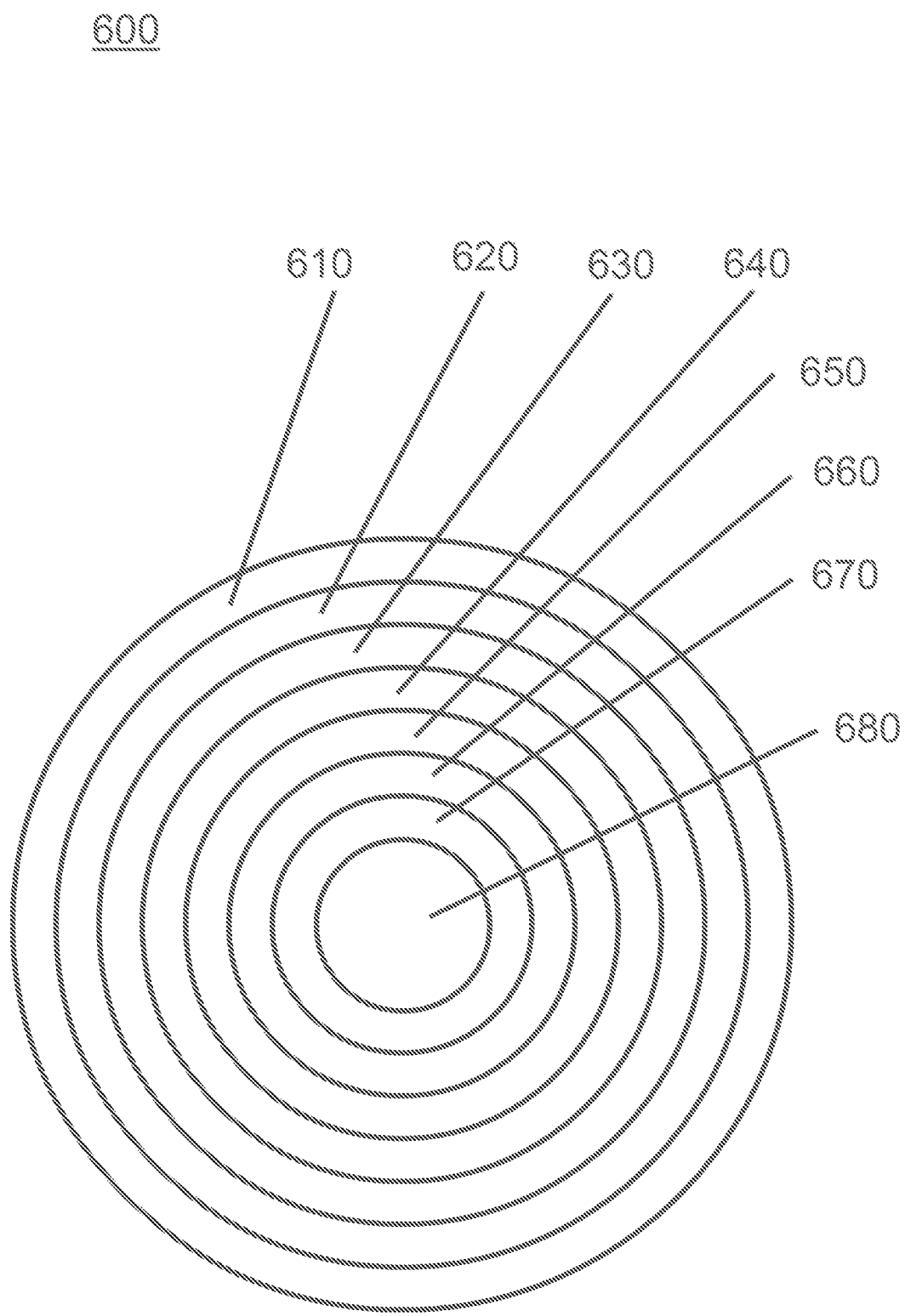
FIG. 6 illustrates an exemplary DRAM capacitor (600).

FIG. 6 illustrates an exemplary DRAM capacitor (600). It includes a top electrode (610,670) that comprises two parts, i.e., an inner shell and an outer shell, in the embodiment shown. This notwithstanding, the top electrode may comprise just one part, or may comprise more than two parts, e.g., three or more parts. It shall be understood that the two parts of the top electrode (610,670) in the embodiment of FIG. 6 are electrically connected to each other (connection not shown), i.e., it shall be understood that during normal operation, they are kept at the same, or approximately the same, electrical potential. The top electrode (610,670) comprises a layer that is deposited by means of a method as described herein. The top electrode (610,670) may, for example, have a thickness of at least 0.5 nm to 5.0 nm, or of at least 1.0 nm to at most 4.0 nm, or of at least 2.0 nm to at most 3.0 nm, or of at least 0.5 nm to at most 2.5 nm, or of at least 0.6 nm to at most 2.0 nm, or of at least 0.7 nm to at most 1.5 nm. The DRAM capacitor (600) further comprises a bottom electrode (640). The bottom electrode (640) may comprise a layer deposited by means of a method as described herein. In some embodiments, the composition of the bottom electrode (640) equals the composition of the top electrode (610,670). Alternatively, the composition of the bottom electrode (640) may differ from the composition of the top electrode (610,670). The bottom electrode (640) may, for example, have a thickness of at least 1.0 nm to at most 10.0 nm or of at least 3.0 nm to at most 7.0 nm, or of at least 0.5 nm to 5.0 nm, or of at least 1.0 nm to at most 4.0 nm, or of at least 2.0 nm to at most 3.0 nm, or of at least 0.5 nm to at most 2.5 nm, or of at least 0.6 nm to at most 2.0 nm, or of at least 0.7 nm to at most 1.5 nm. The bottom electrode (640) is separated from an outer shell of the top electrode (610) by one or more dielectric layers (620,630). The embodiment shown features two dielectric layers (620,630). The one or more dielectric layers (620,630) may comprise a high-k dielectric. For example, the high-k dielectric may be selected from the list comprising hafnium oxide ($HfO_2$), tantalum oxide ($Ta_2O_5$), vanadium oxide ($VO_2$), niobium oxide ($Nb_2O_5$), zirconium oxide ($ZrO_2$), titanium oxide ($TiO_2$), aluminum oxide ($Al_2O_3$), lanthanum oxide ($La_2O_3$), mixtures thereof, and laminates thereof. Other exemplary high-k materials include silicates such as hafnium silicate ($HfSiO_x$), lanthanum silicate ($LaSiO_x$), titanium silicate ($TiSiO_x$), and thulium silicate ($TmSiO_x$), amongst others. In some embodiments, dielectric layer (620) has the same composition as dielectric layer (630). In some embodiments, dielectric layer (620) has a different composition than dielectric layer (630). The combined thickness of the two dielectric layers (620,630) may be, for example, from at least 0.5 nm to at most 10.0 nm or of at least 1.0 nm to at most 8.0 nm, or of at least 2.0 nm to at most 6.0 nm, or of at least 3.0 nm to at most 4.0 nm. An inner shell of the top electrode (670) is separated from the bottom electrode (640) by means of one or more dielectric layers (650,660). The embodiment shown features two such dielectric layers. The one or more dielectric layers (650,660) may comprise a high-k dielectric. For example, the high-k dielectric may be selected from the list comprising hafnium oxide ($HfO_2$), tantalum oxide ($Ta_2O_5$), vanadium oxide ($VO_2$), niobium oxide ($Nb_2O_5$), zirconium oxide ($ZrO_2$), titanium oxide ($TiO_2$), aluminum oxide ($Al_2O_3$) or lanthanum oxide ($La_2O_3$), and mixtures/laminates thereof. Other exemplary high-k materials include silicates such as hafnium silicate ($HfSiO_x$), lanthanum silicate ($LaSiO_x$), titanium silicate ($TiSiO_x$), and thulium silicate ($TmSiO_x$), amongst others. In some embodiments, dielectric layer (650) has the same composition as dielectric layer (660). In some embodiments, dielectric layer (650) has a different composition than dielectric layer (660). The combined thickness of the dielectric layers (650,660) may be, for example, from at least 0.5 nm to at most 10.0 nm or of at least 1.0 nm to at most 8.0 nm, or of at least 2.0 nm to at most 6.0 nm, or of at least 3.0 nm to at most 4.0 nm. In some embodiments, the thickness of the one or more dielectric layers (620,630) between the outer shell of the top electrode (610) and the bottom electrode (640) equals the thickness of the one or more dielectric layers (650,660) between the inner shell of the top electrode (670) and the bottom electrode (640), e.g., within a margin of error of less than 2.0 nm, or less than 1.5 nm, or less than 1.0 nm, or less than 0.5 nm, or less than 0.4 nm, or less than 0.3 nm, or less than 0.2 nm, or less than 0.1 nm. A gap filling dielectric (680) may be centrally disposed in the DRAM capacitor (680). Exemplary gap filling dielectrics include low-k dielectrics, e.g., SiOC, SiOCN, and the like.

Figure 7:
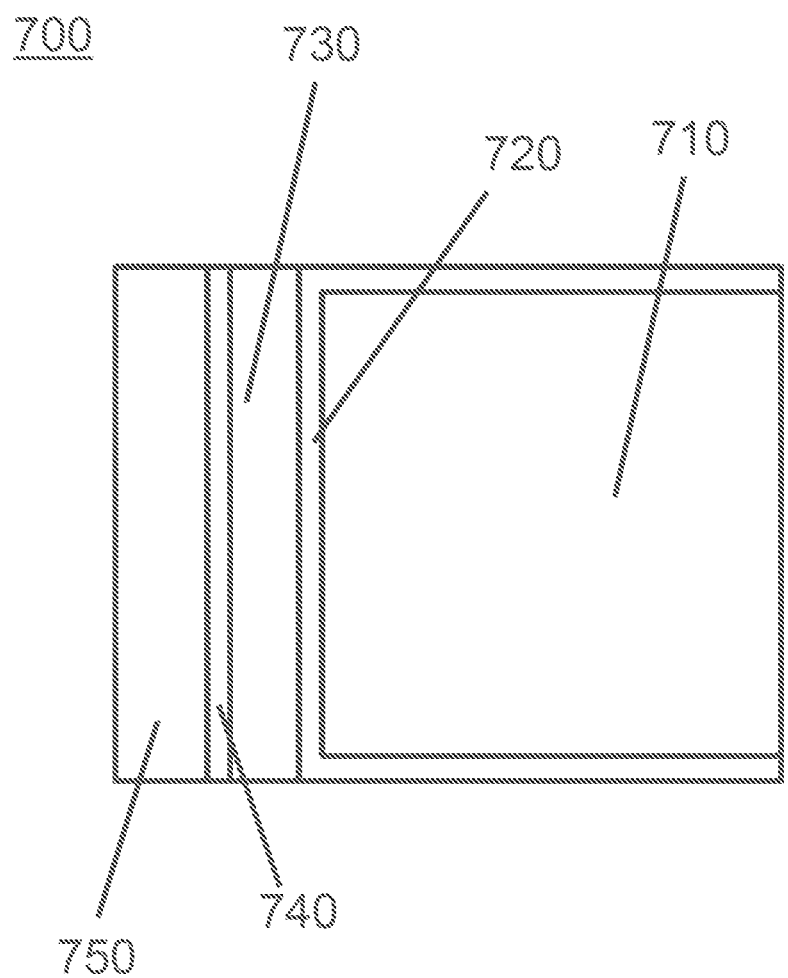
FIG. 7 illustrates a part of a VNAND cell, namely a contact and charge trapping assembly (700).

FIG. 7 illustrates a part of a VNAND cell, namely a contact and charge trapping assembly (700). The contact and charge trapping assembly (700) comprises a metal layer (710). The metal layer (710) may be made from a metal such as copper, tungsten, etc. Alternatively, the metal layer (710)

may comprise a layer that is deposited according to a method as described herein. As illustrated in FIG. 7, the metal layer (710) may be lined with a liner (720). The liner may improve adhesion and/or may prevent or at least minimize out diffusion of metal, e.g., copper or tungsten, from the metal layer (710). Advantageously, the liner (720) comprises a layer that is deposited by means of a method as described herein. The contact and charge trapping assembly (700) comprises a charge trapping layer (740). The charge trapping layer (740) is positioned between two dielectric layers (730,750). The charge trapping layer may comprise a conductive layer such as, for example, silicon nitride. Additionally or alternatively, the charge trapping layer may comprise a layer that is deposited by means of a method as described herein. One of the dielectric layers (730) is adjacent to the liner (720). This dielectric layer (730) may, for example, comprise a high-k material. For example, the high-k dielectric may be selected from the list comprising hafnium oxide ($HfO_2$), tantalum oxide ($Ta_2O_5$), vanadium oxide ($VO_2$), niobium oxide ($Nb_2O_5$), zirconium oxide ($ZrO_2$), titanium oxide ($TiO_2$), aluminum oxide ($Al_2O_3$), lanthanum oxide ($La_2O_3$), and mixtures/laminates thereof. Other exemplary high-k dielectrics include silicates such as hafnium silicate ($HfSiO_x$), lanthanum silicate ($LaSiO_x$), titanium silicate ($TiSiO_x$), and thulium silicate ($TmSiO_x$), amongst others. In a suitable configuration in a VNAND memory architecture, the other dielectric layer (750) may serve as a tunnel layer, and may be adjacent to a, e.g., doped polysilicon, channel layer (not shown).

Figure 8:
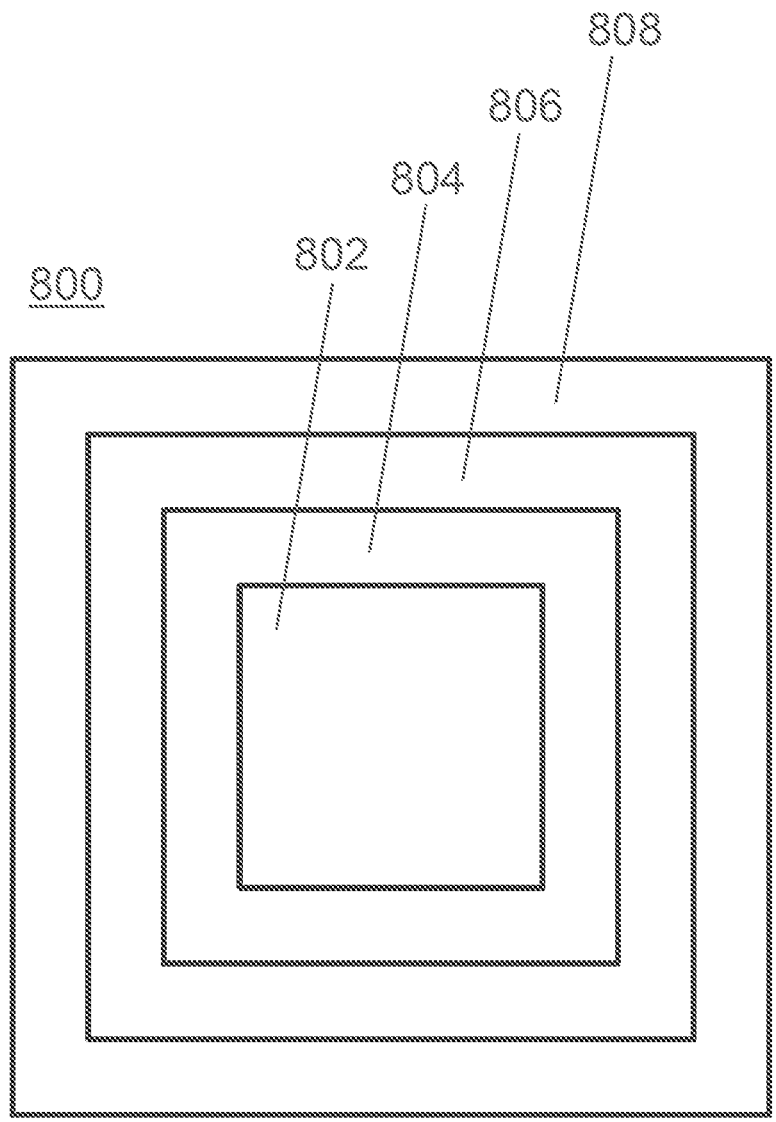
FIG. 8 illustrates another structure (800) in accordance with examples of the disclosure.

FIG. 8 illustrates another structure (800) in accordance with examples of the disclosure. This structure (800) is suitable for gate all around field effect transistors (GAA FET) (also referred to as lateral nanowire FET) devices and the like.

In the illustrated example, the structure (800) includes semiconductor material (802), dielectric material (804), a layer (806) formed by means of a method as described herein, and a conducting layer (808). The structure (800) can be formed overlying a substrate. The layer (806) formed by means of a method as described herein can be positioned between the conducting layer (808) and the dielectric material (806), as shown. Alternatively, the layer (806) formed by means of a method as described herein can be positioned inside the conducting layer (808) (embodiment not shown).

The semiconductor material (802) can include any suitable semiconducting material. For example, the semiconductor material (802) can include Group IV, Group III-V, or Group II-VI semiconductor material. By way of example, the semiconductor material (802) can include silicon.

The dielectric material (804) can be the same, or similar, to a dielectric layer, e.g., a high k dielectric, described elsewhere herein.

In an illustrative experiment to show the feasibility of a method as described herein, a metal nitride was deposited by means of a cyclical deposition process as described herein after subjecting a substrate to a nitrogen plasma for 30 s. While subjecting the substrate to a nitrogen plasma, the plasma gas consisted of Ar, $N_2$, and He, the substrate was maintained at a temperature of 300° C., and the reaction chamber was maintained at a pressure of 5 Torr. In particular, 1.8 slm Ar, 0.8 slm $N_2$, and 0.2 slm He was provided to the reaction chamber while subjecting the substrate to a nitrogen plasma. In two distinct experiments, plasma powers of 150 W and 300 W were used. Then titanium nitride was deposited on the substrate using a cyclical deposition process consisting of 68 sub-cycles of alternating titanium precursor and nitrogen reactant exposure. $TiCl_4$ was used as a titanium precursor, and $NH_3$ was used as a nitrogen reactant. 20.5 Å TiN was grown on a reference sample which was not exposed to the nitrogen plasma. 19.2 Å TiN was grown on a sample that was exposed to a 150 W nitrogen plasma, and 19.9 Å TiN was grown on a sample that was exposed to a 300 W nitrogen plasma. Thus, TiN growth can be effectively inhibited by means of a $N_2$ containing plasma. Without the invention being bound by any particular theory or mode of operation, it is believed that the presently disclosed methods allow filling gaps in a bottom-up way because a proximal surface of a gap feature is inhibited more than a distal surface of a gap feature when a substrate comprising such a gap feature is subjected to a nitrogen-containing plasma, such as a plasma in which the plasma gas comprises $N_2$.

The example embodiments of the disclosure described herein do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

In the present disclosure, where conditions and/or structures are not specified, the skilled artisan in the art can readily provide such conditions and/or structures in view of the present disclosure, as a matter of routine experimentation.

What is claimed is:

1. A method for filling a gap feature, the method comprising, in the given order:
    a step of positioning a substrate on a substrate support in a reaction chamber, the substrate comprising a substrate surface comprising one or more gap features, the one or more gap features comprising a proximal part comprising a proximal surface and a distal part comprising a distal surface;
    a step of subjecting the substrate to a plasma treatment, thereby selectively inhibiting the proximal surface with respect to the distal surface; and,
    a step of selectively depositing a metal nitride on the distal surface,
    wherein a metal of the metal nitride is a rare earth metal or a transition metal,
    wherein the metal nitride is conductive, and
    wherein the plasma treatment comprises exposing the substrate to a noble gas plasma.

2. The method according to claim 1 wherein a plurality of super-cycles are executed, a super cycle comprising the step of subjecting the substrate to the plasma treatment, and the step of selectively depositing the metal nitride on the distal surface.

3. The method according to claim 1 wherein the step of selectively depositing the metal nitride on the distal surface comprises a cyclical process, the cyclical process comprising a plurality of sub cycles, a sub cycle comprising, in the given order:
    a step of exposing the substrate to a metal precursor, thereby forming chemisorbed metal precursor on the distal surface; and,
    a step of exposing the substrate to a nitrogen reactant;

thereby allowing the nitrogen reactant to react with the chemisorbed metal precursor, thus forming a metal nitride on the distal surface.

4. The method according to claim 3 wherein the step of exposing the substrate to a metal precursor and the step of exposing the substrate to a nitrogen reactant are separated by an intra sub cycle purge.

5. The method according to claim 3 wherein subsequent sub-cycles are separated by an inter sub cycle purge.

6. The method according to claim 3 wherein the metal comprises the transition metal.

7. The method according to claim 6 wherein the transition metal comprises titanium.

8. The method according to claim 3 wherein the metal precursor comprises one or more alkylamine ligands.

9. The method according to claim 3 wherein the metal precursor has a general formula of $M(NR_2)_n$, wherein M is a metal, R is a linear or branched C1 to C4 alkyl, and is an integer from at least 2 to at most 5.

10. The method according to claim 3 wherein the metal precursor comprises a metal halide.

11. The method according to claim 10 wherein the metal halide comprises a chloride.

12. The method according to claim 11 wherein the metal halide comprises $TiCl_4$.

13. The method according to claim 3 wherein the nitrogen reactant comprises $N_2H_2$.

14. The method according to claim 1 wherein the metal is the rare earth metal.

15. The method according to claim 1 wherein the plasma treatment consists of exposing the substrate to the noble gas plasma.

16. The method according to claim 15 wherein the step of selectively depositing a metal nitride comprises providing a metal precursor comprising one or more ligands selected from $NH_2$, $NHR^i$, and $NR^iR^{ii}$, with at least one of $R^i$ and $R^{ii}$ being a C1 to C4 alkyl.

17. The method according to claim 1 wherein the substrate is maintained at a temperature of at least 50° C. to at most 300° C.

18. The method according to claim 1 wherein the plasma treatment comprises exposing the substrate to a nitrogen ($N_2$), argon, and helium plasma.

19. The method according to claim 1 wherein a concentration of constituents of the metal nitride varies from the distal surface to the proximal surface.

* * * * *